United States Patent [19]
Huang

[11] Patent Number: 5,918,120
[45] Date of Patent: Jun. 29, 1999

[54] METHOD FOR FABRICATING CAPACITOR-OVER-BIT LINE (COB) DYNAMIC RANDOM ACCESS MEMORY (DRAM) USING TUNGSTEN LANDING PLUG CONTACTS AND TI/TIN BIT LINES

[75] Inventor: Jenn Ming Huang, Hsin-Chu, Taiwan

[73] Assignee: Taiwan Semiconductor Manufacturing Company, Ltd., Hsin-Chu, Taiwan

[21] Appl. No.: 09/121,711

[22] Filed: Jul. 24, 1998

[51] Int. Cl.[6] .............................................. H01L 21/8242
[52] U.S. Cl. ........................................ 438/239; 438/254
[58] Field of Search .................................. 438/238, 239, 438/253–256, 381, 396–399

[56] References Cited

U.S. PATENT DOCUMENTS

| | | | |
|---|---|---|---|
| 5,130,885 | 7/1992 | Fazan et al. | 361/313 |
| 5,364,817 | 11/1994 | Lur et al. | 437/192 |
| 5,534,462 | 7/1996 | Fiordalice et al. | 437/190 |
| 5,576,240 | 11/1996 | Radosevich et al. | 437/60 |
| 5,631,179 | 5/1997 | Sung et al. | 438/264 |
| 5,780,338 | 7/1998 | Jeng et al. | 438/253 |
| 5,837,591 | 11/1998 | Shimada et al. | 438/381 |

Primary Examiner—Joni Y. Chang
Attorney, Agent, or Firm—George O. Saile; Stephen B. Ackerman

[57] ABSTRACT

A method and structure are described for making DRAM devices having bit line contacts for memory cells and landing plugs for peripheral devices with a Ti/TiN barrier layer patterned to form bit lines and local interconnections. FETs are formed on the substrate for memory cells and for devices in the peripheral area. A planar first insulating layer is deposited, and contact openings are formed to the devices. A Ti/TiN barrier layer is deposited in the contact openings and a tungsten (W) layer is deposited and selectively etched back to the barrier layer. The barrier layer is then patterned to form bit lines and local interconnections. A second insulating layer is deposited, and capacitor node contact openings are etched and filled with polysilicon to form node contacts on which capacitors are fabricated. A planar third insulating layer is formed and multilevel contact openings are etched to landing plugs. Metal plugs are formed in the multilevel contact openings, and a first metal is deposited and patterned to form the first level of metal interconnections. The reduced height of the Ti/TiN bit lines and the landing plug contacts significantly reduce the aspect ratio of the multilevel contacts, allowing for fabricating DRAM circuits with higher density and improved reliability.

29 Claims, 5 Drawing Sheets

METHOD FOR FABRICATING CAPACITOR-OVER-BIT LINE (COB) DYNAMIC RANDOM ACCESS MEMORY (DRAM) USING TUNGSTEN LANDING PLUG CONTACTS AND TI/TIN BIT LINES

BACKGROUND OF THE INVENTION (1) Field of the Invention

This invention relates to integrated circuit semiconductor devices, and more particularly to a method for fabricating dynamic random access memory devices having tungsten (W) landing plug contacts and titanium/titanium nitride (Ti/TiN) bit lines. This reduces the aspect ratio for multilevel contacts and provides a more reliable process for increased circuit density.

(2) Description of the Prior Art

As integrated circuit density increases, it becomes increasing difficult to manufacture ultra large scale integrated (ULSI) circuits. One of the problems associated with making these dense circuits is the increase in the number of material layers that result in the need to pattern high-aspect-ratio features in the underlying layers. One area of concern is the multilevel contact openings that must be etched to wire up the discrete devices on an integrated circuit. One area where this is of particular concern is the DRAM circuit. For example, the number of memory cells on the DRAM chip has dramatically increased in recent years, and is expected to reach 1 Gigabit by the year 2000. This increase in circuit density has resulted from the downsizing of the individual semiconductor devices (FETs), which is due in part to advances in high-resolution photolithography and directional (anisotropic) plasma etching. The downsizing has resulted in multilevel contact openings with very high aspect ratios. It is necessary to provide planar surfaces to form photolithographic images with good fidelity, but requires etching contact openings in relatively thick layers having large aspect ratios, for example greater than 7. This makes it difficult to etch the contact openings and to reliably fill the openings with metal contacts.

One method of circumventing this problem is to form landing plug contacts on the substrate to which the multilevel contact openings with reduced aspect ratios can be etched. For example, methods for forming self-aligned metal plugs to substrates have been reported in the literature. One method is described by Sung in U.S. Pat. No. 5,631,179 in which a Ti/TiN barrier layer and tungsten plugs are formed in the contact openings. An insulating layer is deposited and contact openings are formed. An AlCuSi layer is then deposited and patterned to connect the tungsten plugs. Another method for making contact plugs for integrated circuits is described by Fiordalice et al. in U.S. Pat. No. 5,534,462 in which a TiN barrier layer or glue layer is eliminated to reduce processing complexity. Instead, an aluminum nitride (AlN) is used as the glue layer to improve the tungsten adhesion to the insulating layer and the AlN does not have to be removed when the tungsten is patterned. Lur in U.S. Pat. No. 5,364,817 describes a method for making improved tungsten plugs that avoids voids in the plug (dog-bone structure), and protects the contact areas from junction failure and prevents failure due to stress in the contacts. Fazan et al., U.S. Pat. No. 5,130,885, teaches a method of making DRAM cells using a rough capacitor surface to increase capacitance. The capacitor is essentially flat and the DRAM structure is relatively thin, therefore Fazan does not address the need for etching high-aspect-ratio contacts.

Therefore there is still a need in the industry to provide a process that further reduce the aspect ratio of the multilevel contact openings in addition to the reduction achieved by using the prior-art method of including the landing plug contacts. It is also desirable to integrate the bit line and bit-line plug contacts in the memory cell area with the landing plug contacts in the peripheral area of the chip to provide a more cost-effective manufacturing process and to reduce the chip size.

SUMMARY OF THE INVENTION

It is a principal object of the present invention to form dynamic random access memory (DRAM) cells having capacitor-over-bit line (COB) structures with tungsten (W) landing plug contacts for multilevel contacts having reduced aspect ratios.

It is another object of the present invention to replace tungsten/polysilicon bit lines with titanium/titanium nitride (Ti/TiN) to reduce the vertical thickness of the overall DRAM structure.

A further objective of the present invention is to use the patterned Ti/TiN as local interconnections to reduce chip size.

Still another objective of the present invention, by a second embodiment, is to utilize polysilicon plug pedestals for making DRAM structures using these Ti/TiN bit lines.

In this invention a method is described for making dynamic random access memory (DRAM) cells having self-aligned landing plug contacts. The method also forms bit lines and local interconnections in a novel way from a Ti/TiN barrier layer that reduces aspect ratios for the multilevel contacts and also reduces chip size. The method begins by providing a semiconductor substrate. Typically the substrate is a P$^-$ doped single-crystal silicon having a <100> crystallographic orientation. A relatively thick Field OXide (FOX) is formed that surrounds and electrically isolates device areas in and on the substrate for the DRAM memory cells and for peripheral devices. One conventional method of forming the field oxide areas is by a shallow trench isolation (STI) method, as commonly practiced in the industry. The FETs are formed next by growing a thin gate oxide on the device areas. A multilayer of a heavily N$^+$ doped polysilicon layer, a refractory metal silicide layer, and a silicon oxide/silicon nitride layer are deposited and patterned to form polycide FET gate electrodes with a cap oxide. For submicron FET structures, lightly doped source/drain areas and insulating sidewall spacers are included to improve the device characteristics (short-channel effects). Source/drain contact areas are then formed by ion implanting an N type dopant, such as phosphorus ions (P$^{31}$), adjacent to the sidewall spacers on the FET gate electrodes to complete the FETS. By including both P and N wells in the silicon substrate, both N-channel and P-channel FETs can be formed to provide Complementary Metal Oxide Semiconductor (CMOS) circuits in and on the periphery of the DRAM chip.

Continuing, a relatively thick first insulating layer, composed of a silicon oxide (SiO$_2$) layer, is deposited and chemically/mechanically polished to provide a planarized surface. Bit line contact openings are anisotropically etched in the first insulating layer to one of the two source/drain contact areas in each memory cell. Concurrently device contact openings are etched in the peripheral device area of the chip. An electrically conducting first barrier layer, composed of Ti and an upper TiN layer, is deposited over the first insulating layer and in the contact openings. A first conducting layer composed of tungsten (W) is deposited to fill the contact openings. Now, a key feature of this invention, the tungsten is selectively etched back to the TiN surface to form landing plug contacts. The TiN layer is then patterned to form the bit lines over the bit line contact openings in the memory cell areas. Concurrently the Ti/TiN is patterned in the peripheral device areas to form local interconnections. The thinner Ti/TiN replaces the more conventional tungsten silicide ($WSi_2$)/polysilicon bit lines, thereby reducing the vertical thickness of the DRAM chip and improving the aspect ratios for the multilevel contact openings. An essentially planar second insulating layer is deposited on the substrate. Capacitor node contact openings are anisotropically etched in the second and first insulating layers to the source/drain contact areas for node contacts in the memory cells. A doped polysilicon layer is deposited to fill the capacitor node contact openings. The capacitor bottom electrodes are then formed aligned over the node contacts utilizing the polysilicon layer. A variety of bottom electrode structures, such as cylindrical, conical, fin-shaped, and the like, can be formed as commonly practiced in the industry. An interelectrode dielectric layer is deposited, and a second conducting layer is deposited and patterned to form capacitor top electrodes for the capacitors. A third insulating layer, sufficiently thick to cover the capacitors, is deposited and polished back to form a planar surface. Multilevel contact openings are now etched in the third and second insulating layers in the peripheral device area to the landing plug contacts. Because of the landing plug contacts and the reduced thickness of the DRAM structure (thinner bit lines), the multilevel contact openings are etched having a substantially reduced aspect ratio. A second barrier layer, for example composed of Ti/TiN, is deposited on the third insulating layer and in the multilevel contact openings. A third conducting layer, composed of W, is deposited sufficiently thick to fill the multilevel contact openings, and is selectively etched back to the second barrier layer to form the multilevel contacts. A first metal layer, composed of aluminum/copper (Al/Cu) alloy, is deposited and patterned to complete the DRAM circuit up to and including the first level of metal interconnections.

A second embodiment describes a method in which polysilicon plug pedestals are utilized with the Ti/TiN bit lines to form a similar structure having low aspect ratio multilevel contacts.

BRIEF DESCRIPTION OF THE DRAWINGS

The objects and advantages of this invention are best understood with reference to the attached drawings in the figures and the embodiments that follows.

DESCRIPTION OF THE PREFERRED EMBODIMENTS

Referring now to FIGS. 1 through 4 and in keeping with the objects of this invention, a detailed first embodiment is described for making novel DRAM devices having Ti/TiN bit lines and tungsten (W) landing plugs for the bit lines, while forming landing plug contacts on the periphery of the DRAM chip to reduce the aspect ratio for the multilevel contacts. Although the process is described for making memory cells for DRAM devices having N-channel FETs as the access transistors, it should also be well understood by one skilled in the art that by including additional process steps, in addition to those described in this embodiment, other types of devices can be included on the DRAM chip. For example, by forming N-well regions in a P− doped substrate, P-channel FETs can also be provided and Complementary Metal-Oxide-Semiconductor (CMOS) circuits can be formed therefrom, such as are required for the peripheral circuits on the DRAM chip. It should also be well understood by those skilled in the art that the structure and the method for making the Ti/TiN bit lines with tungsten contacts and local interconnections for embedded DRAMs is applicable to semiconductor integrated circuits in general.

Figure 1:
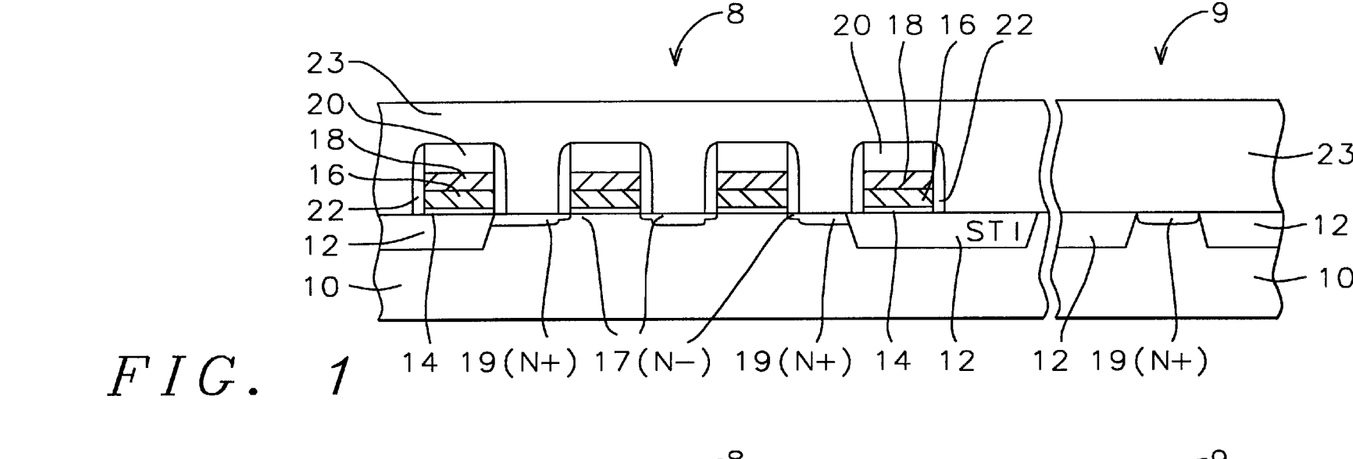
FIGS. 1 through 4 are schematic cross-sectional views for the sequence of process steps, by a first embodiment, for making a novel DRAM devices using a patterned titanium/titanium nitride barrier layer for the bit lines and landing plug contacts for reducing the aspect ratio of the multilevel contacts.

Referring to FIG. 1, the method begins by providing a semiconductor substrate 10, a portion of which is shown in the Fig., having memory cell regions 8 and peripheral regions 9. Typically the substrate is a P− doped single-crystal silicon having a <100> crystallographic orientation. Field OXide (FOX) regions 12 are formed surrounding and electrically isolating the device areas. Portions of the FOX 12 are depicted in the Fig. for one of the memory cell areas. One conventional method of forming the field oxide regions is by using a shallow trench isolation (STI) method, as commonly practiced in the industry. Generally the STI is formed by etching trenches in the field oxide regions on the substrate to a depth of between about 2500 and 10000 Angstroms. After forming a thin thermal oxide in the trenches, the trenches are filled with an insulating material such a chemical vapor deposited $SiO_2$, and are made planar with the surface of the substrate 10, for example, by using a planarizing etchback or chemical/mechanical polishing (CMP). Next, a thin gate oxide 14 of about 70 to 200 Angstroms is grown on the device areas. The FET gate electrodes are then formed by depositing an N+ doped polysilicon layer 16, for example by low pressure chemical vapor deposition (LPCVD), and is typically deposited to a thickness of between about 500 and 2000 Angstroms. A refractory metal silicide layer 18, preferably composed of tungsten silicide ($WSi_2$), is deposited by LPCVD to a thickness of between about 500 and 1500 Angstroms. A cap oxide layer 20, composed of $SiO_2$ with a top $Si_3N_4$ layer, is deposited. Layer 20 is deposited preferably by LPCVD and has a thickness of between about 1000 and 2000 Angstroms. Layers 20, 18, and 16 are patterned using conventional photolithographic techniques and anisotropic plasma etching to form polycide gate electrodes, having a cap oxide 20, over the active device areas 8, while forming word lines over the FOX 12.

Still referring to FIG. 1, for submicron FET structures, a common practice is to include lightly doped source/drain areas 17(N−) to improve the device characteristics, such as minimizing short-channel effects. Typically the lightly doped regions are formed by implanting phosphorus ions ($P^{31}$). Insulating sidewall spacers 22 are formed on the sidewalls of the gate electrodes (18,16). The sidewall spacers 22 are formed preferably by depositing a conformal $Si_3N_4$ layer using LPCVD, and anisotropically plasma etching back the $Si_3N_4$ layer. The $Si_3N_4$ is deposited to a preferred thickness of between about 500 and 2000 Angstroms prior to etching. Source/drain contact areas 19(N+) are now formed by ion implanting an N type dopant, such as $P^{31}$, adjacent to the FET gate electrodes to complete the FETs. The contacts 19(N+) are preferably doped to a final concentration of between about 1.0 E 19 and 1.0 E 21 atoms/cm$^3$.

Continuing with FIG. 1, a relatively thick first insulating layer 23 is deposited and planarized to have a thickness of between about 5000 and 10000 Angstroms over the gate electrodes. Layer 23 is preferably a silicon oxide deposited by LPCVD using tetraethosiloxane/ozone (TEOS/O$_3$) as the reactant gas mixture. Alternatively, a doped oxide such as borophosphosilicate glass (BPSG) can be used as the first insulating layer.

Figure 2:
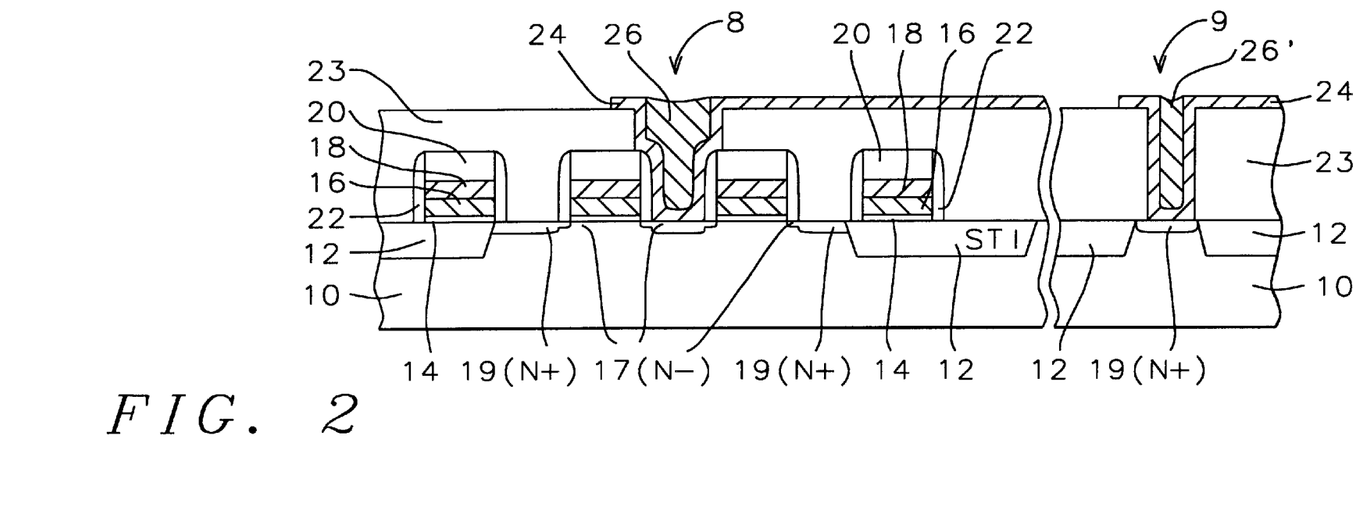

Referring to FIG. 2, conventional photolithographic techniques and anisotropic plasma etching are used to etch contact openings 2 for the bit lines in the first insulating layer 23 over the memory cell area 8. At the same time, contact openings 4 are etched in the first insulating layer over the peripheral area 9 of the chip. Preferably the contact openings are etched using high-density plasma (HDP) etching and an etchant gas mixture using a fluorine-containing gas having a high etch-rate selectivity of SiO$_2$ to silicon of at least greater than 20:1.

Still referring to FIG. 2, an electrically conducting first barrier layer 24 is deposited over the first insulating layer 23 and in the contact openings 2 and 4. Layer 24 is preferably composed of a Ti layer having an upper TiN layer. The Ti layer is preferably deposited by physical vapor deposition (PVD) using, for example, sputter deposition. The Ti layer is deposited to a preferred thickness of between about 100 and 300 Angstroms, and more specifically to a thickness of about 200 Angstroms. The upper TiN layer is then deposited, for example by sputter deposition from a Ti target using argon (Ar) and a nitrogen (N$_2$) reactant gas. The TiN is deposited to a thickness of between about 100 and 300 Angstroms, and more specifically to a thickness of about 200 Angstroms. This Ti/TiN layer 24 (200 and 200 Angstroms) provides a sheet resistance Rs of about 14 ohms per square, which is comparable in sheet resistance to a much thicker tungsten silicide/polysilicon layer. A conformal first conducting layer 26 is deposited to a thickness sufficient to fill the contact openings 2 and 4 to form the bit line contacts in the memory cell area 8 and landing plug contacts in the peripheral area 9. Layer 26 is preferably tungsten (W), and is deposited by CVD using tungsten hexafluoride (WF$_6$).

Continuing with FIG. 2 and a key feature of this invention is to selectively etch back the tungsten layer 26 to the surface of the TiN layer (upper portion of layer 24) to form bit line contacts and landing plug contacts. The Ti/TiN is retained for forming the bit lines and local interconnections having low Rs. The etch-rate selectivity of W to Ti/TiN is very high. For example, an etch selectivity of about 50:1 can be achieved using HDP etching and an etchant gas such as sulfur hexafluoride (SF$_6$) and argon (Ar).

The Ti/TiN is then patterned by photolithographic techniques and anisotropic plasma etching to form the bit lines 24 over the bit line contacts 26 in the memory cell area 8. Concurrently the Ti/TiN is patterned in the peripheral device areas 9 to form local interconnections 24' that include the landing plug contacts 26'. The thin Ti/TiN 24 (about 1300 Angstroms) replaces the more conventional tungsten silicide (WSi$_2$)/polysilicon bit lines, thereby reducing the vertical thickness of the DRAM chip and improving the aspect ratios for the multilevel contact openings.

Figure 3:
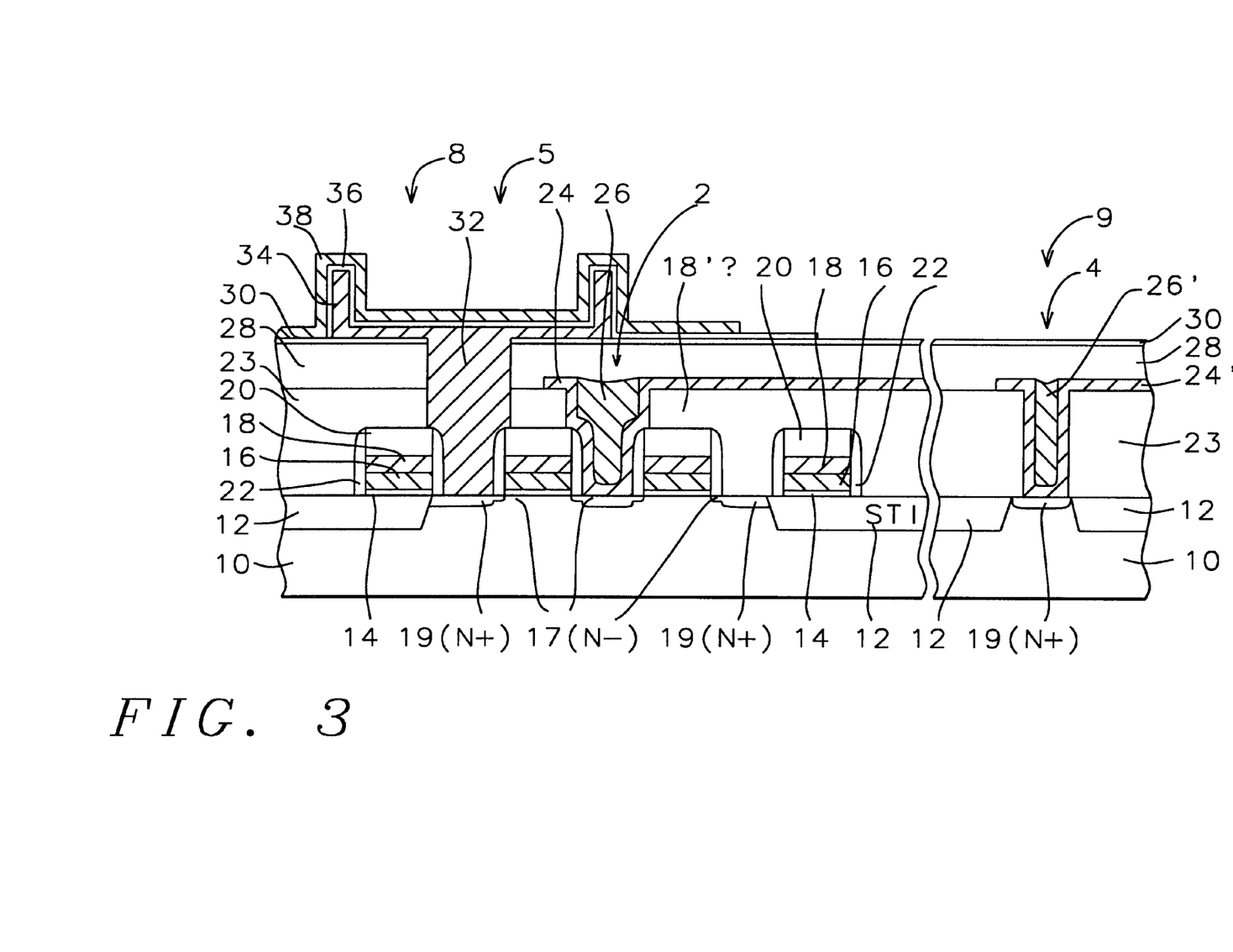

Referring now to FIG. 3, a second insulating layer 28 is deposited over the patterned Ti/TiN bit lines and local interconnections on the substrate, and is planarized. Layer 28 is preferably SiO$_2$ deposited by plasma-enhanced CVD using TEOS/O$_3$ as the reactant gas. The preferred thickness of planarized layer 28 over the Ti/TiN layer is between about 2000 and 4000 Angstroms. Alternatively, an etch-stop layer 30 can be included to facilitate forming the bottom electrodes for the capacitors, which are fabricated next.

Continuing, capacitor node contact openings 5 are anisotropically etched in the second and first insulating layers 28 and 23 to the source/drain contact areas 19(N+) for node contacts in the memory cell area 8 self-aligned to the gate electrodes. The openings 5 are preferably etched using HDP and an etchant gas containing fluoride. Next, a doped polysilicon layer 32 is deposited to fill the capacitor node contact openings 5. Layer 32 is deposited by LPCVD, and is in-situ doped with phosphorus to a concentration of between about 1.0 E 19 and 1.0 E 21 atoms/cm$^3$. The capacitor bottom electrodes are then formed aligned over the node contacts. A variety of methods commonly practiced in the industry can be used to make the capacitors. For example, cylindrical-shaped, fin-shaped, and the like, can be formed. For example, one method is to use the doped polysilicon layer 32, which is patterned, to have a cylindrical-shaped bottom electrode 34 as depicted in FIG. 3. The capacitors are now completed by depositing an interelectrode dielectric layer 36, which has a high dielectric constant. Layer 36 is typically SiO$_2$/Si$_3$N$_4$/SiO$_2$ (ONO), tantalum pentoxide (Ta$_2$O$_5$), and the like, and is deposited to a thickness of between about 40 and 60 Angstroms. A second conducting layer 38 is deposited and patterned to form the capacitor top electrodes, typically composed of a doped polysilicon, or other conducting materials such as W or TiN. The thickness of layer 38 is between about 500 and 1000 Angstroms.

Figure 4:
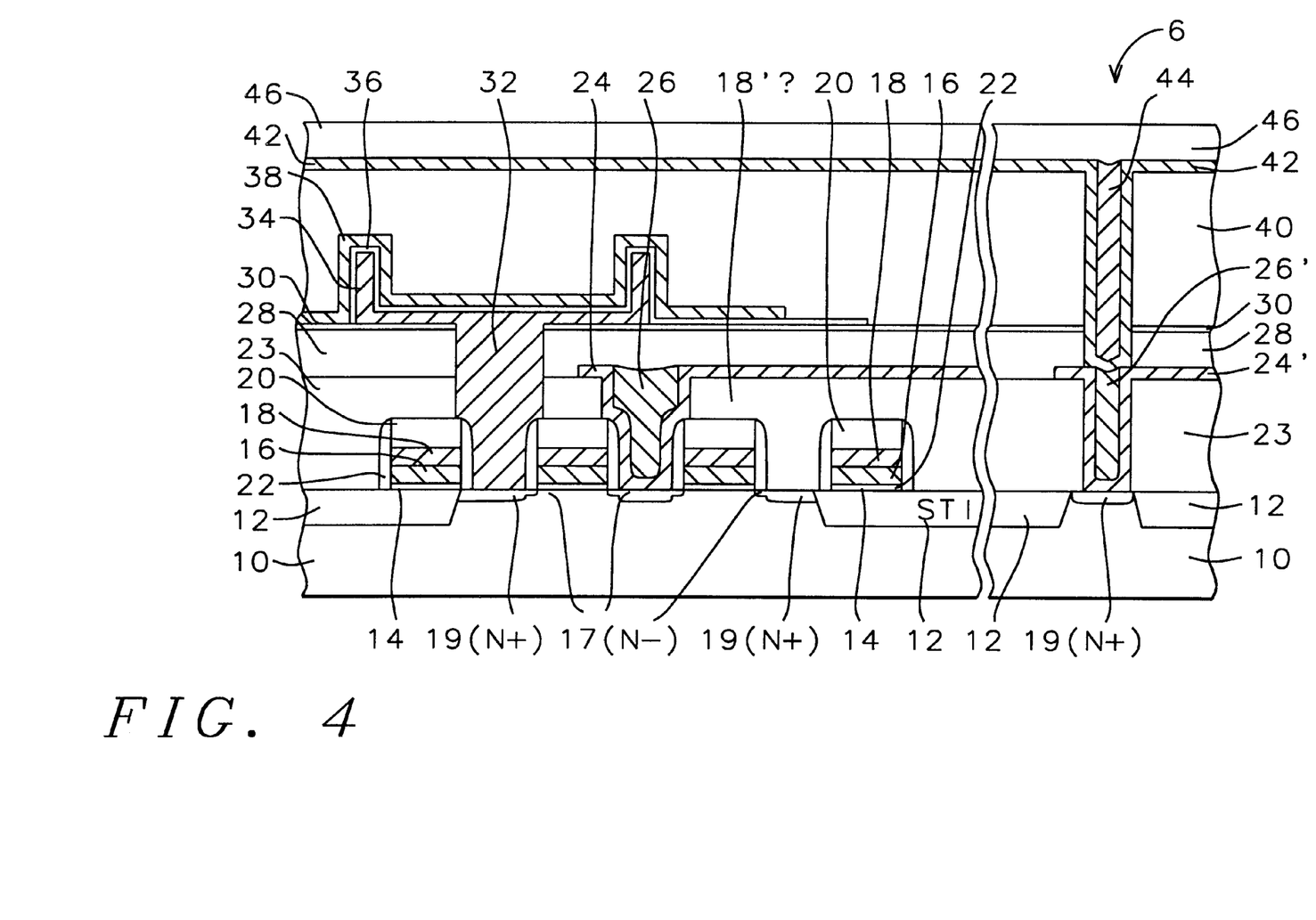

Referring to FIG. 4, a third insulating layer 40 sufficiently thick to cover the capacitors, is deposited and polished back to form a planar surface. Layer 40 is chemically/mechanically polished back to have a thickness of between about 2000 and 4000 Angstroms over the capacitors. Preferably layer is composed of SiO$_2$, and is deposited by plasma-enhanced CVD using TEOS/O$_3$ as the reactant gas mixture.

Still referring to FIG. 4, the DRAM circuit is completed up to the first level of metal interconnections. Multilevel contact openings 6 are now etched in the peripheral device area 9 through the third and second insulating layers 40 and 28 and the etch-stop layer 30, if present. The multilevel contact openings 6 are etched to the landing plug contacts 26'. The contact openings 6 are preferably etched using photolithographic techniques and anisotropic plasma etching. The etching is carried out using a HDP etcher using an etchant gas containing fluorine, such as carbon tetrafluoride (CF$_4$) that etches selectively to the W landing plug contacts 26'. The aspect ratio of the contact openings 6 is substantially reduced because of the landing plug contacts and the reduced thickness of the DRAM structure due to the thinner Ti/TiN bit lines.

Continuing with FIG. 4, a second barrier layer 42 is deposited on the third insulating layer 40 and in the multilevel contact openings 6. Layer 42 is preferably composed of Ti/TiN, and is also deposited by PVD similar to the process for depositing the first barrier layer 24. The Ti of the second barrier layer 42 is preferably deposited to a thickness of between about 100 and 300 Angstroms, and the TiN portion is deposited to a thickness of between about 100 and 300 Angstroms. Next, a third conducting layer 44, composed of W, is deposited sufficiently thick to fill the multilevel contact openings 6, and is selectively etched back to the second barrier layer 42 to form the multilevel contacts 44.

The etch-back is similar is the etching of the W for the bit line contacts 26 and the landing plugs 26', having an etch-rate selectivity of about 50:1. A first metal layer 46 is deposited and the metal layer and the second barrier layer 42 are patterned to complete the DRAM circuit up to and including the first level of metal interconnections. The metal layer 46 is preferably composed of aluminum/copper (Al/Cu) alloy, and is deposited by PVD to a thickness of between about 3000 and 5000 Angstroms.

Figure 5:
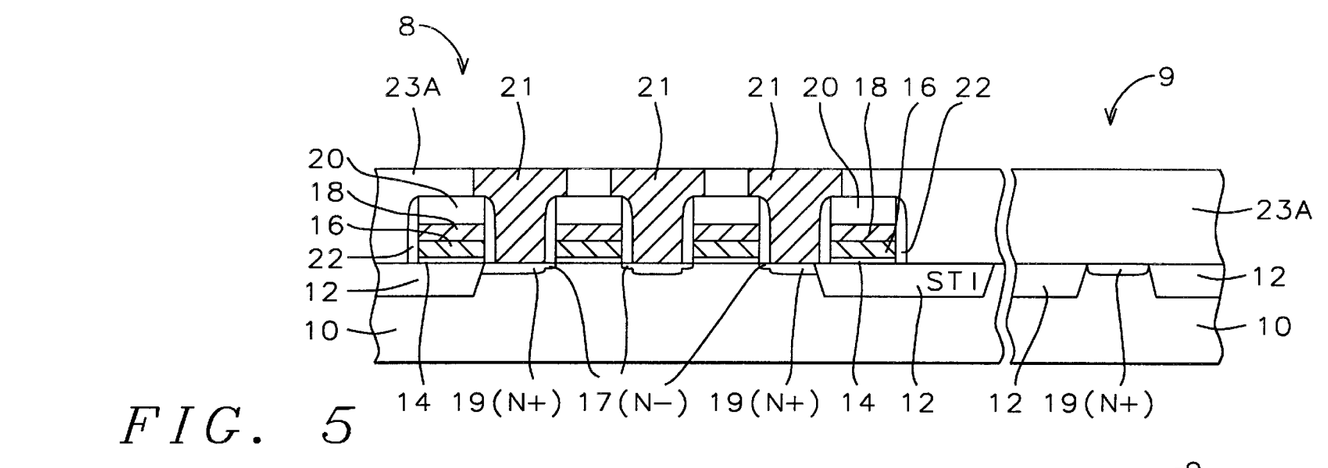
FIGS. 5 through 7 are schematic cross-sectional views for the sequence of process steps, by a second embodiment, for making these novel DRAM devices including polysilicon plug pedestals with the patterned titanium/titanium nitride bit lines and landing plug contacts for reducing the aspect ratio of the multilevel contacts.
Figure 6:
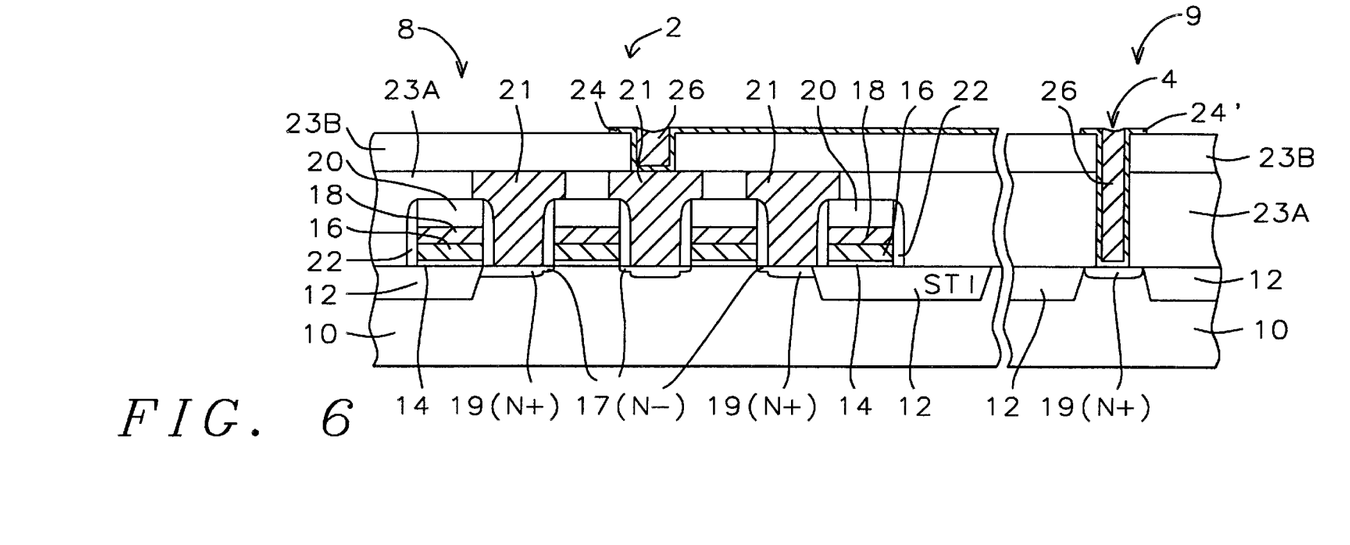
Figure 7:
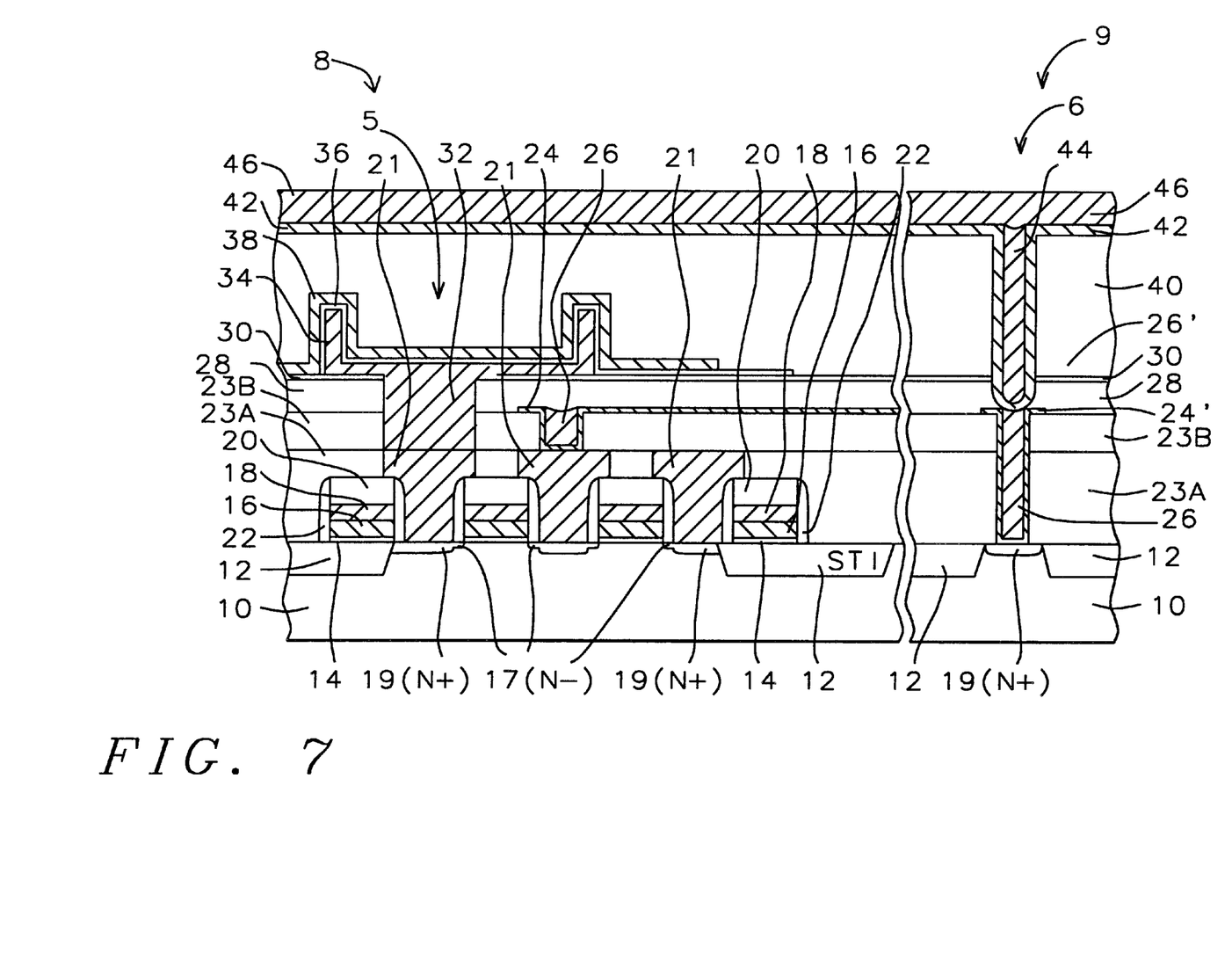

Referring now to FIGS. 5–7, a second embodiment of this invention describes a method for making a similar DRAM circuit as described in the first embodiment utilizing polysilicon plug pedestals to which the Ti/TiN bit line contacts and the capacitor node contacts are formed. The method of the second embodiment is identical to the first embodiment up to and including the completion of the FET devices in FIG. 1. All the elements similar to the first embodiment are labeled identically in the second embodiment. A major difference in the second embodiment is that layer 23 is deposited in two separate layers 23A and 23B. As shown in FIG. 5, an insulating layer 23A of $SiO_2$ is deposited by LPCVD to have a thickness of between about 4000 and 6000 Angstroms after planarizing. Next, self-aligned contact openings for bit lines and capacitor node contacts are etched in layer 23A in the memory cell area 8 to the source/drain contact areas 19($N^+$). An $N^+$ doped polysilicon layer 21 is deposited by LPCVD to fill the contact openings and is polished back to form polysilicon plug pedestals 21, as shown in FIG. 5.

Then as shown in FIG. 6, the second portion 23B of the first insulating layer, also composed of $SiO_2$, is then deposited by LPCVD to a thickness of between about 1000 and 2000 Angstroms. The bit line contact openings 2 in the memory cell area 8 are etched to the polysilicon plug pedestals, and the contact openings 4 for the landing plug contacts are etched to the substrate 10 in the peripheral area 9. The following process sequence is identical to the first embodiment and is only briefly described. A first barrier layer 24 (Ti/TiN) is deposited and a first conducting layer 26 (W) is deposited and selectively etched back to layer 24. The Ti/TiN layer 24 is patterned to form the bit lines 24 and the local interconnections 24', as shown in FIG. 6.

Referring to FIG. 7, the second insulating layer 28, and if necessary, an etch-stop layer 30 is deposited. The node contact openings 5 are etched in layers 30, 28, and 23B to the polysilicon plug pedestals 21 for the capacitor node contacts. A second $N^+$ doped polysilicon layer 32 is deposited to fill the node contacts and to form portions of the capacitor bottom electrodes 36. An interelectrode dielectric layer 34 is deposited, and a conducting layer 38 is deposited and patterned to form the capacitor top electrodes. A third insulating layer 40 composed of $SiO_2$ is deposited and planarized over the capacitors. The multilevel contacts 6 are etched in layers 40, 30, and 28 to the W landing plug contacts 26' in the kerf area 9. This method also results in reduced aspect ratios resulting from the thinner Ti/TiN bit lines and because of the W landing plug contacts. The DRAM circuit is now completed up to the first level of metal by depositing a second Ti/TiN barrier layer 42 in the multilevel contact openings 6, followed by the deposition of a W layer 44 which is selectively etched back to layer 42 to form the multilevel metal contacts in the openings 6. The first level of metal is formed by depositing and patterning an Al/Cu alloy 46.

While the invention has been particularly shown and described with reference to the preferred embodiment thereof, it will be understood by those skilled in the art that various changes in form and details may be made without departing from the spirit and scope of the invention.

What is claimed is:

1. A method for making dynamic random access memory (DRAM) devices comprising the steps of:

providing a semiconductor substrate having device areas for memory cells and for peripheral devices surrounded and electrically isolated from each other by field oxide areas, and further providing field effect transistors having gate electrodes formed from a patterned polycide layer on said device areas, and said gate electrodes having insulating sidewall spacers and source/drain contact areas adjacent to said gate electrodes in said device areas;

depositing a first insulating layer, which is planarized;

anisotropically etching bit line contact openings in said first insulating layer to said source/drain contact areas in said memory cells and concurrently etching device contact openings in peripheral device area;

depositing an electrically conducting first barrier layer over said first insulating layer and in said contact openings;

depositing a first conducting layer to fill said contact openings and etching back said first conducting layer to said first barrier layer to form landing plug contacts;

patterning said electrically conducting first barrier layer to form bit lines over said bit line contact openings, and concurrently to form local interconnections in said peripheral device area;

depositing a second insulating layer essentially planar over said substrate and over said bit lines and said local interconnections;

anisotropically etching capacitor node contact openings in said second and first insulating layers to said source/drain contact areas in said memory cells;

forming capacitor node contacts by depositing a doped polysilicon layer to fill said capacitor node contact openings, and forming capacitor bottom electrodes aligned over said capacitor node contacts;

depositing an interelectrode dielectric layer;

depositing and patterning a second conducting layer to form capacitor top electrodes to make capacitors;

depositing a third insulating layer sufficiently thick to cover said capacitors and polishing back to form a planar surface;

anisotropically etching multilevel contact openings in said third and second insulating layers in said peripheral device area to said landing plug contacts;

depositing an electrically conducting second barrier layer on said third insulating layer and in said multilevel contact openings;

depositing a third conducting layer sufficiently thick to fill said multilevel contact openings, and etching back to said second barrier layer to form multilevel contacts;

depositing a first metal layer and patterning to complete a first level of metal interconnections for said DRAM devices.

2. The method of claim 1, wherein said first insulating layer is silicon oxide and is deposited to a thickness of between about 5000 and 10000 Angstroms.

3. The method of claim 1, wherein said first barrier layer is composed of a titanium layer having a thickness of between about 100 and 300 Angstroms, and a titanium nitride top layer having a thickness of between about 100 and 300 Angstroms.

4. The method of claim 1, wherein said first and third conducting layers are tungsten (W).

5. The method of claim 1, wherein said second insulating layer is silicon oxide having a thickness of between about 2000 and 4000 Angstroms.

6. The method of claim 5, wherein said second insulating layer includes an etch-stop layer of silicon nitride having a thickness of between about 100 and 300 Angstroms.

7. The method of claim 1, wherein said doped polysilicon layer is deposited by plasma-enhanced chemical vapor deposition and is doped in situ to a concentration of between 1.0 E 19 and 1.0 E 21 atoms/cm$^3$.

8. The method of claim 1, wherein said interelectrode dielectric layer is a material selected from the group consisting of silicon oxide/silicon nitride/silicon oxide (ONO), tantalum pentoxide, and barium strontium titanium oxide (BaSr)TiO$_3$.

9. The method of claim 1, wherein said second electrically conducting barrier layer is titanium and a top layer of titanium nitride.

10. The method of claim 1, wherein said first metal layer is an aluminum copper alloy.

11. A method for making dynamic random access memory (DRAM) devices comprising the steps of:

providing a semiconductor substrate having device areas for memory cells and for peripheral devices surrounded and electrically isolated from each other by field oxide areas, and further providing field effect transistors having gate electrodes formed from a patterned polycide layer on said device areas, and said gate electrodes having insulating sidewall spacers and source/drain contact areas adjacent to said gate electrodes in said device areas;

depositing a first insulating layer, which is planarized;

anisotropically etching bit line contact openings in said first insulating layer to said source/drain contact areas in said memory cells and concurrently etching device contact openings in peripheral device area;

depositing an electrically conducting first barrier layer composed of titanium and titanium nitride over said first insulating layer and in said contact openings;

depositing a first conducting layer composed of tungsten and filling said contact openings, and etching back said first conducting layer to said first barrier layer to form landing plug contacts;

patterning said electrically conducting first barrier layer to form bit lines over said bit line contact openings, and concurrently to form local interconnections in said peripheral device area;

depositing a second insulating layer essentially planar over said substrate and over said bit lines and said local interconnections;

anisotropically etching capacitor node contact openings in said second and first insulating layers to said source/drain contact areas in said memory cells;

forming capacitor node contacts by depositing a doped polysilicon layer to fill said capacitor node contact openings, and forming capacitor bottom electrodes aligned over said capacitor node contacts;

depositing an interelectrode dielectric layer;

depositing and patterning a second conducting layer to form capacitor top electrodes to make capacitors;

depositing a third insulating layer sufficiently thick to cover said capacitors and polishing back to form a planar surface;

anisotropically etching multilevel contact openings in said third and second insulating layers in said peripheral device area to said landing plug contacts;

depositing an electrically conducting second barrier layer on said third insulating layer and in said multilevel contact openings;

depositing a third conducting layer, composed of tungsten, sufficiently thick to fill said multilevel contact openings, and etching back to said second barrier layer to form multilevel contacts;

depositing a first metal layer and patterning to complete a first level of metal interconnections for said DRAM devices.

12. The method of claim 11, wherein said first insulating layer is silicon oxide and is deposited to a thickness of between about 5000 and 10000 Angstroms.

13. The method of claim 11, wherein said titanium has a thickness of between about 100 and 300 Angstroms, and said titanium nitride has a thickness of between about 100 and 300 Angstroms.

14. The method of claim 11, wherein said second insulating layer is silicon oxide having a thickness of between about 2000 and 4000 Angstroms.

15. The method of claim 14, wherein said second insulating layer includes an etch-stop layer of silicon nitride having a thickness of between about 100 and 300 Angstroms.

16. The method of claim 11, wherein said doped polysilicon layer is deposited by plasma-enhanced chemical vapor deposition and is doped in situ to a concentration of between 1.0 E 19 and 1.0 E 21 atoms/cm$^3$.

17. The method of claim 11, wherein said interelectrode dielectric layer is a material selected from the group consisting of silicon oxide/silicon nitride/silicon oxide (ONO), tantalum pentoxide, and barium strontium titanium oxide (BaSr)TiO$_3$.

18. The method of claim 11, wherein said second electrically conducting barrier layer is titanium and a top layer of titanium nitride.

19. The method of claim 11, wherein said first metal layer is an aluminum copper alloy.

20. A method for making dynamic random access memory (DRAM) devices comprising the steps of:

providing a semiconductor substrate having device areas for memory cells and for peripheral devices surrounded and electrically isolated from each other by field oxide areas, and further providing field effect transistors having gate electrodes formed from a patterned polycide layer on said device areas, and said gate electrodes having insulating sidewall spacers and source/drain contact areas adjacent to said gate electrodes in said device areas;

depositing a bottom portion of a first insulating layer, which is planarized;

anisotropically etching contact openings in said bottom portion of said first insulating layer to said source/drain contact areas in said memory cells for bit line contacts and capacitor node contacts;

depositing a doped first polysilicon layer and patterning to form polysilicon plug pedestals in said contact openings;

depositing a top portion of said first insulating layer;

anisotropically etching bit line contact openings in said top portion of said first insulating layer to said polysilicon plug pedestals in said memory cells for said bit line contacts and concurrently etching device contact openings in said top and said bottom portions of said first insulating layer to said substrate in peripheral device area;

depositing an electrically conducting first barrier layer over said first insulating layer and in said contact openings;

depositing a first conducting layer to fill said contact openings and etching back said first conducting layer to said first barrier layer to form landing plug contacts;

patterning said electrically conducting first barrier layer to form bit lines extending over said bit line contact openings, and concurrently to form local interconnections in said peripheral device area;

depositing a second insulating layer essentially planar over said substrate and over said bit lines and said local interconnections;

anisotropically etching capacitor node contact openings in said second insulating layer and said top portion of said first insulating layers to said polysilicon plug pedestals in said memory cells;

forming capacitor node contacts by depositing a doped second polysilicon layer to fill said capacitor node contact openings, and forming capacitor bottom electrodes aligned over said capacitor node contacts;

depositing an interelectrode dielectric layer;

depositing and patterning a second conducting layer to form capacitor top electrodes to make capacitors;

depositing a third insulating layer sufficiently thick to cover said capacitors and polishing back to form a planar surface;

anisotropically etching multilevel contact openings in said third and second insulating layers in said peripheral device area to said landing plug contacts;

depositing an electrically conducting second barrier layer on said third insulating layer and in said multilevel contact openings;

depositing a third conducting layer sufficiently thick to fill said multilevel contact openings, and etching back to said second barrier layer to form multilevel contacts;

depositing a first metal layer and patterning to complete a first level of metal interconnections for said DRAM devices.

21. The method of claim 20, wherein said bottom portion of said first insulating layer is silicon oxide and is deposited to a thickness of between about 4000 and 6000 Angstroms, and said top portion of said first insulating layer is silicon oxide and is deposited to a thickness of between about 1000 and 2000 Angstroms.

22. The method of claim 20, wherein said first barrier layer is composed of a titanium layer having a thickness of between about 100 and 300 Angstroms, and a titanium nitride top layer having a thickness of between about 100 and 300 Angstroms.

23. The method of claim 20, wherein said first and third conducting layers are tungsten (W).

24. The method of claim 20, wherein said second insulating layer is silicon oxide having a thickness of between about 2000 and 4000 Angstroms.

25. The method of claim 20, wherein said second insulating layer includes an etch-stop layer of silicon nitride having a thickness of between about 100 and 300 Angstroms.

26. The method of claim 20, wherein said doped first and second polysilicon layers are deposited by plasma-enhanced chemical vapor deposition and are doped in situ to a concentration of between $1.0 \text{ E } 19$ and $1.0 \text{ E } 21$ atoms/cm$^3$.

27. The method of claim 20, wherein said interelectrode dielectric layer is a material selected from the group consisting of silicon oxide/silicon nitride/silicon oxide (ONO), tantalum pentoxide, and barium strontium titanium oxide $(BaSr)TiO_3$.

28. The method of claim 20, wherein said second electrically conducting barrier layer is titanium and a top layer of titanium nitride.

29. The method of claim 20, wherein said first metal layer is an aluminum copper alloy.

* * * * *